(12) United States Patent
Endo et al.

(10) Patent No.: US 6,610,357 B2
(45) Date of Patent: Aug. 26, 2003

(54) METHOD FOR FABRICATING ELECTRODE FOR LITHIUM SECONDARY BATTERY

(75) Inventors: Koji Endo, Katano (JP); Katsunobu Sayama, Katano (JP); Hisaki Tarui, Shijyonawate (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/995,753

(22) Filed: Nov. 29, 2001

(65) Prior Publication Data

US 2002/0102350 A1 Aug. 1, 2002

(30) Foreign Application Priority Data

Dec. 1, 2000 (JP) .......................... 2000-366877

(51) Int. Cl.[7] .............. B05D 5/12; B05D 3/00; C23C 14/00; C23C 16/00
(52) U.S. Cl. .......... 427/172; 427/58; 427/171; 427/318; 427/327; 427/248.1; 427/255.28; 427/446; 427/453; 204/192.1
(58) Field of Search ............... 427/58, 372.2, 427/327, 318, 171, 172, 255.28, 248.1, 446, 453; 204/192.1

(56) References Cited

U.S. PATENT DOCUMENTS

| | | | |
|---|---|---|---|
| 6,044,792 A | 4/2000 | Ogawa et al. ........... 118/723 E |
| 6,051,285 A | 4/2000 | Kin ............................. 427/569 |
| 6,168,661 B1 | 1/2001 | Dinkelman ................. 118/245 |
| 6,235,427 B1 | 5/2001 | Idota et al. ............... 429/218.1 |
| 6,255,017 B1 | 7/2001 | Turner ...................... 429/218.1 |
| 6,258,408 B1 | 7/2001 | Madan et al. ............ 427/255.5 |
| 6,273,955 B1 | 8/2001 | Yoshino et al. .............. 118/718 |
| 6,306,215 B1 * | 10/2001 | Larkin .......................... 118/249 |
| 6,402,796 B1 * | 6/2002 | Johnson ...................... 29/623.5 |
| 6,428,933 B1 * | 8/2002 | Christensen et al. ... 429/231.95 |

FOREIGN PATENT DOCUMENTS

| | | |
|---|---|---|
| JP | 5-271932 A | 10/1993 |
| JP | 2000-17426 A | 1/2000 |
| JP | 2000-260715 A | 9/2000 |
| WO | 00/03444 A1 | 1/2000 |
| WO | 01/29912 A1 | 4/2001 |
| WO | 01/29913 A1 | 4/2001 |
| WO | 01/29914 A1 | 4/2001 |
| WO | 01/29918 A1 | 4/2001 |
| WO | 01/31720 A1 | 5/2001 |
| WO | 01/31721 A1 | 5/2001 |
| WO | 01/31722 A1 | 5/2001 |
| WO | 01/31723 A1 | 5/2001 |
| WO | 01/31724 A1 | 5/2001 |
| WO | 01/52337 A1 | 7/2001 |
| WO | 01/56099 A1 | 8/2001 |

* cited by examiner

Primary Examiner—Michael Barr
(74) Attorney, Agent, or Firm—Kubovcik & Kubovcik

(57) ABSTRACT

A method for fabricating an electrode for lithium secondary battery characterized by applying a tension to a metallic foil so as to pull an area of the metallic foil on which a thin film composed of active material is deposited, from the both sides in the direction of longitude, when depositing the thin film on the metallic foil serving as a current collector.

15 Claims, 3 Drawing Sheets

METHOD FOR FABRICATING ELECTRODE FOR LITHIUM SECONDARY BATTERY

BACKGROUND OF THE INVENTION

1. Field of the Invention

The present invention relates to a method for fabricating a novel electrode for lithium secondary battery.

2. Related Art

In a lithium secondary battery having been actively researched and developed recently, battery characteristics such as charge/discharge voltages, charge/discharge cycle life characteristics, and storage characteristic are greatly influenced by an electrode used. Therefore, battery characteristics are enhanced by improving an active material used for an electrode.

Although it is possible to constitute a battery having high energy densities per weight and volume by using lithium metal as a negative active material, a problem occurs that lithium is deposited like dendrite to cause an internal short-circuiting.

On the other hand, a secondary lithium battery is reported which uses any one of aluminum, silicon, and tin which are electrochemically alloyed with lithium under charge (Solid State Ionics, 113–115, p.57(1998). Among the above materials, silicon is particularly prospective as negative electrode for a battery with a high capacity, having a large theoretical capacity. For this reason, various secondary batteries respectively using silicon for the negative electrode are proposed (Japanese Patent Laid Open No. Hei10-255768). In the case of the negative alloy electrode of this type, however, a sufficient cycle characteristic is not obtained because the alloy that is an electrode active material is pulverized due to charge/discharge and thereby, the current-collecting characteristic is deteriorated.

In order to overcome these problems, proposed is an electrode for lithium secondary battery obtained by forming a microcrystalline silicon thin film or an amorphous silicon thin film on a current collector through a thin-film forming method such as CVD method or sputtering method, which electrode shows excellent charge/discharge cycle characteristics (International Patent Laid Open WO01/31720A1 etc.).

The above electrode for lithium secondary battery is formed by using a metallic foil as a current collector and depositing a silicon thin film on the metallic foil through the thin-film forming method. However, warping or wrinkle may be produced on the metallic foil, when a silicon thin film is formed on a metallic foil. When warping or wrinkle is present on a current collector, the charge/discharge reaction becomes ununiform and charge/discharge cycle characteristics are deteriorated.

SUMMARY OF THE INVENTION

It is an object of the present invention to provide a method for fabricating an electrode for lithium secondary battery capable of preventing warping or wrinkle from being produced on a current collector when depositing an active thin film, and capable of forming an uniform active thin film on the current collector.

The present invention is a method for fabricating an electrode for lithium secondary battery formed by depositing an active thin film on a metallic foil serving as a current collector, in which a tension is applied to the metallic foil so as to pull an area on which the active thin film formed, from the both sides, during the deposition of the active thin film.

According to the present invention, it is possible to prevent warping or wrinkle from being produced on a current collector because of applying a tension to a metallic foil so as to pull an area on which an active thin film is formed, when depositing the active thin film. When depositing an active thin film on a metallic foil through sputtering method or CVD method, the temperature of the metallic foil is increased due to the energy of deposited fine particles. When the temperature of the metallic foil increases, the metallic foil expands and thereby, warping or wrinkle is produced on the metallic foil. The present invention makes it possible to prevent a warping or wrinkle from being produced by the above expansion because of applying a tension from the both sides so as to pull an area on which an active thin film is deposited. Therefore, it is possible to form a uniform active thin film on a current collector.

In the present invention, it is preferable to put a metallic foil on a support. Moreover, it is preferable to put the metallic foil on the support and apply a tension so that the metallic foil closely contacts with the support. By applying a tension to contact with the support closely, it is possible to more securely prevent warping or wrinkle from being produced. Moreover, by bringing the metallic foil in close contact with the support, it is possible to release the heat produced in the metallic foil to the support and thereby, prevents the temperature of the metallic foil from ununiformly increasing.

Furthermore, it is preferable that a device for controlling the temperature of the metallic foil is provided in the support. Thereby, it is possible to further uniform the temperature distribution of the support. Furthermore, the above temperature control device is preferably for cooling the metallic foil. By providing the cooling device, it is possible to efficiently suppress a temperature rise of the metallic foil.

Furthermore, it is preferable that a portion of a support contacting with a metallic foil has a curved shape. Specifically, it is preferable the portion is a convex curved shape. Such a shape improves the adhesion between the metallic foil and the support so as to uniformly control the temperature of the active thin film deposition area of the metallic foil. As a support having such a shape, a roller is exemplified. When using a roller as a support, it may use a continuous type thin-film forming apparatus which allows continuous feeding of a metallic foil and continuous forming of an active thin film on the metallic foil. In this case, a roller may rotate in accordance with the movement of the metallic foil. Alternatively, a roller-shaped support which does not rotate may be used.

An active thin film of the present invention is formed by depositing the film on a metallic foil. As a method for forming an active thin film by depositing the film, preferably used is a method in which a raw material is supplied from a gaseous phase to form the thin film. This type of the method includes sputtering, CVD, vacuum evaporation, and thermal spraying methods.

An active thin film of the present invention is a thin film composed of active material capable of absorbing and releasing lithium. An active thin film absorbing lithium by being alloyed with lithium is preferably used. As a material for the above active thin film, silicon, germanium, tin, lead, zinc, magnesium, sodium, aluminum, gallium, and indium are given as examples.

It is preferable to use an active material mainly containing silicon or germanium from the viewpoint that it is easy to form a thin film by the thin-film forming method from gaseous phase. Moreover, from the viewpoint of a high charge/discharge capacity, it is particularly preferable to use an active material mainly containing silicon. It is preferable that an active thin film is an amorphous thin film or a microcrystalline thin film. Therefore, an amorphous silicon thin film or microcrystalline silicon thin film is preferably used as an active thin film. The amorphous silicon thin film is a thin film in which a peak around 520 cm$^{-1}$ corresponding to a crystal region is not substantially detected through the Raman spectroscopic analysis, and the microcrystalline silicon thin film is a thin film in which both a peak around 520 cm$^{-1}$ corresponding to a crystal region and a peak around 480 cm$^{-1}$ corresponding to an amorphous region are substantially detected through the Raman spectroscopic analysis. Moreover, it is preferable to use an amorphous germanium thin film, a microcrystalline germanium thin film, an amorphous silicon-germanium alloy thin film, and a microcrystalline silicon-germanium alloy thin film.

Although a metallic foil used as a current collector of the present invention is not restricted as far as the foil can be used as a current collector of an electrode for lithium secondary battery, it is preferable to use a metallic foil made of a metal not alloyed with lithium. A copper foil or nickel foil is used as this type of the metallic foil.

We have already found that when using a copper foil as a metallic foil and depositing a silicon thin film as an active thin film, the copper component in the copper foil diffuses in the silicon thin film and a mixed layer is formed at the interface between the copper foil and the silicon thin film. We have also found that when the copper component properly diffuses in the silicon thin film, a solid solution of copper and silicon is formed in the mixed layer and thereby the adhesion between the copper foil and the silicon thin film is improved. Furthermore, we have found that when the copper component is excessively diffused in a silicon thin film, the intermetallic compound of copper and silicon is formed and the silicon thin film is easily peeled from a copper foil. The difference between these diffusion states also relates to the temperature when depositing a silicon thin film. Namely, when the temperature of a copper foil excessively increases, copper excessively diffuses. Therefore, by bringing a metallic foil into close contact with a support and suppressing a temperature rise of the metallic foil, it is possible to improve the adhesion between the active thin film and the metallic foil.

Accordingly, a fabricating method of the present invention is particularly useful in the case that the temperature of the metallic foil increases and the component of the metallic foil diffuses in the active thin film to form a mixed layer at the interface between the metallic foil and the active thin film. According to the present invention, it is possible to suppress a temperature rise of the metallic foil and control the diffusion of the metallic foil component in the active thin film.

The thickness of a metallic foil of the present invention is not restricted, but it is preferable that the foil has a thickness of 5 to 40 μm as a current collector of an electrode for lithium secondary battery.

DESCRIPTION OF THE PREFERRED EMBODIMENTS

The present invention is described in more detail below based on embodiments. However, the present invention is not restricted to the following embodiments. Various modifications of the present invention are allowed as far as the modifications are not deviated from the scope of the present invention.

EXAMPLE 1

Figure 1:
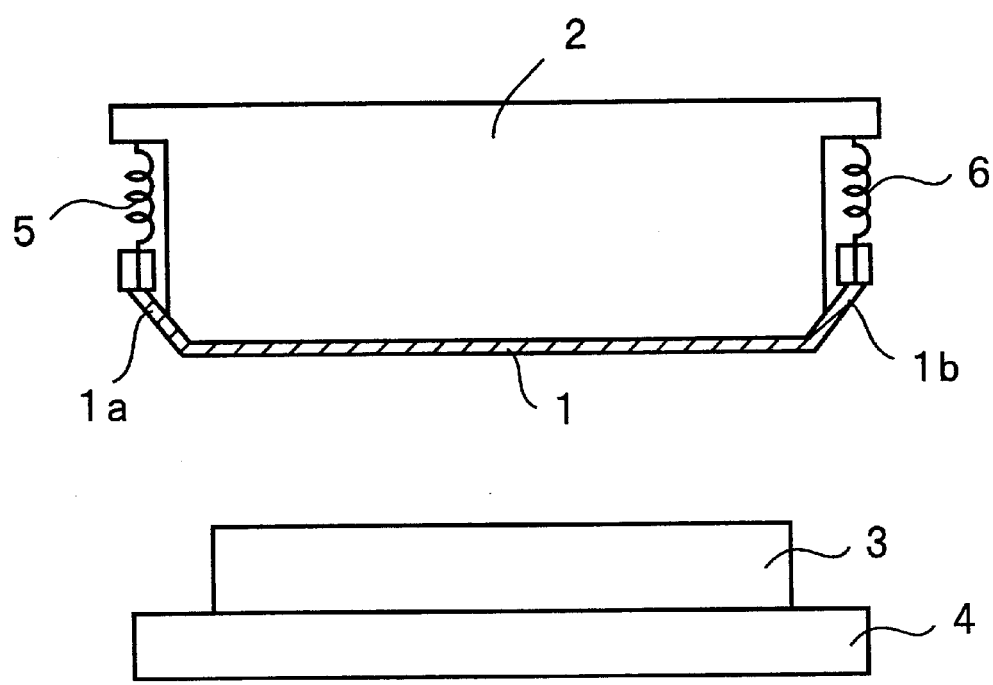
FIG. 1 is a schematic view showing a thin-film forming apparatus used for an embodiment of the present invention.

As shown in FIG. 1, a silicon thin film was formed on a metallic foil 1 by putting the metallic foil 1 on a support 2, setting springs 5 and 6 to both ends 1a and 1b of the metallic foil 1, and applying tensions so as to pull the metallic foil 1 from the both sides. Tensions by the springs 5 and 6 were set so that a force of 4 N (Newton) or more for 1 m of the width of the metallic foil 1 was applied.

A silicon thin film was formed by DC magnetron sputtering method. As a metallic foil 1, electrolytic copper foil (thickness of 18 μm) was used. As a target 3, single crystal silicon (P-type, 1 Ω·cm or less of conductivity) was used. A target 3 was placed on a backing plate 4.

After exhausting a vacuum chamber until the pressure becomes 1×10$^{-3}$ Pa or lower, argon gas was introduced into the chamber from an introduction port until the pressure became 0.5 Pa to form an amorphous silicon thin film (thickness of 6 μm) on the metallic foil 1 at a power density of 3 W/cm$^2$ and a distance between target and substrate of 10 cm.

EXAMPLE 2

Figure 2:
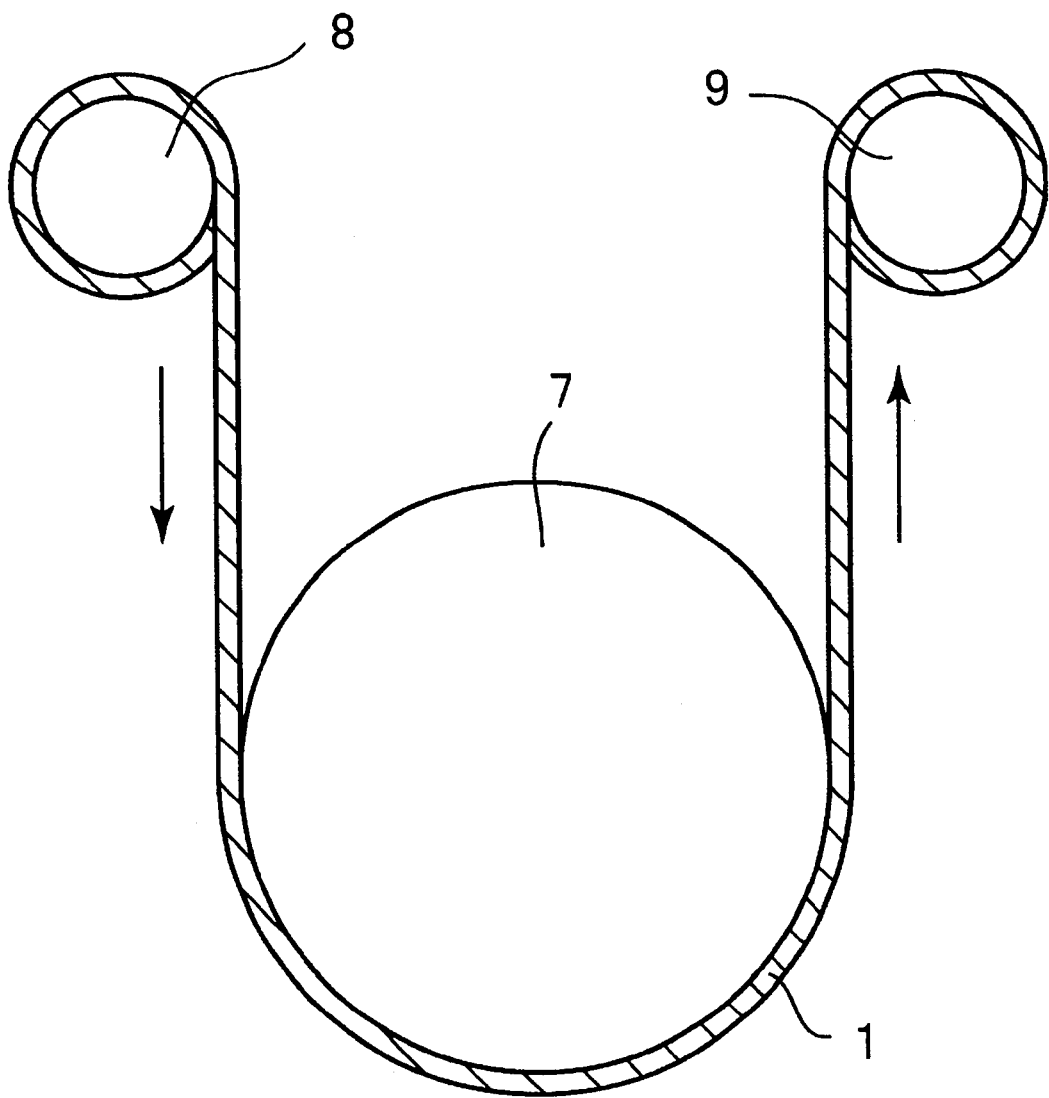
FIG. 2 is a schematic view showing a thin-film forming apparatus used for another embodiment of the present invention.

As shown in FIG. 2, a roller 7 was used as a support and a silicon thin film was formed on the metallic foil 1 while bringing the metallic foil 1 into close contact with the outer surface of the roller 7. The metallic foil 1 was fed from a feed roller 8 to the roller 7 and wound on a winding roller 9. The winding force by the roller 9 was adjusted so that a tension of 4 N or more for 1 m of the width of the metallic foil 1 was applied to the metallic foil 1 on the roller 7.

A cooling device for suppressing a temperature rise under sputtering was provided in the roller 7. A target 3 and a backing plate 4 were provided similarly to the case of the apparatus shown in FIG. 1.

By feeding the metallic foil 1 from the feed roller 8 and winding the metallic foil 1 by the winding roller 9, the metallic foil was continuously fed onto the roller 7 to continuously form a silicon thin film on the metallic foil 1. As the metallic foil 1, the same foil as the case of example 1 is used. An amorphous silicon thin film (thickness of 6 μm) was formed on the metallic foil 1 under the same thin-film forming conditions as example 1.

In the apparatus shown in FIG. 2, a cooling device was provided in the roller 7. Therefore, it was possible to suppress a temperature rise of the metallic foil 1 when forming a thin film. The maximum temperature of the metallic foil during formation of the thin film was 300° C. in example 1, while the maximum temperature of a metallic foil was 220° C. in this example.

COMPARATIVE EXAMPLE 1

Figure 3:
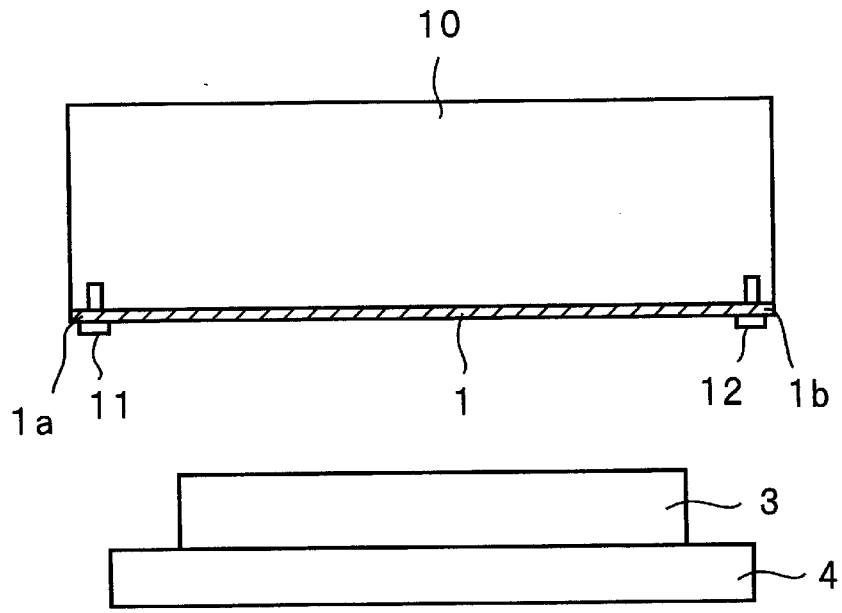
FIG. 3 is a schematic view showing a thin-film forming apparatus used for a comparative example.

As shown in FIG. 3, a silicon thin film was formed on a metallic foil 1 similarly to example 1 except for setting the metallic foil 1 onto a support 10, fixing the both ends 1a and 1b of the metallic foil 1 by fixing units 11 and 12.

While no warping or wrinkle was found on a metallic foil after forming a silicon thin film in examples 1 and 2, warping or wrinkle was found on a metallic foil in comparative example 1. The maximum temperature of the metallic foil 1 when forming a thin film was 350° C.

[Evaluation of Charge/Discharge Characteristics of Lithium Secondary Battery]

A lithium secondary battery was fabricated by using electrodes of examples 1 and 2 and comparative example 1 as negative electrodes to evaluate the charge/discharge characteristics.

A positive electrode was fabricated as described below. 90 parts by weight of $LiCoO_2$ powder and 5 parts by weight of artificial graphite powder serving as a conducting material were added to 5% by weight of an N-methylpyrrolidone aqueous solution containing 5 parts by weight of polyvinylidene fluoride serving as a binder to prepare a mixed slurry for positive electrode. The slurry was applied onto an aluminum foil (thickness of 20 μm) serving as a positive current collector through the doctor blade method and dried to form a positive active material layer. A positive electrode tab was set on the area of an aluminum foil to which the positive active material was not applied, to finish a positive electrode.

A negative electrode was finished by setting a negative electrode tab on an area on which no silicon thin film is formed.

Figure 4:
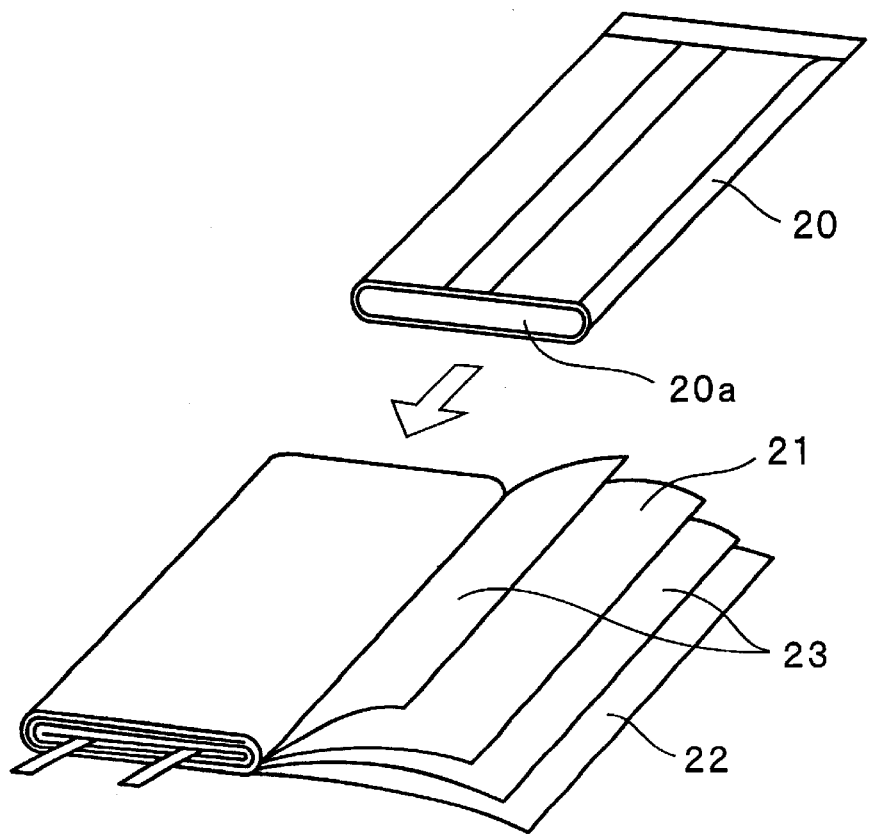
FIG. 4 is an exploded perspective view showing a lithium secondary battery fabricated for an embodiment of the present invention.

The lithium secondary battery shown in FIG. 4 was fabricated by using the positive and negative electrodes obtained as described above.

As shown in FIG. 4, a separator 23 was placed between a positive electrode 21 and a negative electrode 22, and moreover another separator 23 was placed on the positive electrode 21, and these were wound and pressed to be flat and inserted into a casing 20. Then, an electrolyte was injected into the casing 20 and then the opening 20a of the casing 20 was closed to finish a lithium secondary battery. The electrolyte was prepared by dissolving 1 mol/l of $LiPF_6$ in a mixed solvent obtained by mixing ethylene carbonate and diethyl carbonate at a volume ratio of 1:1.

A charge/discharge cycle test was performed to each lithium secondary battery fabricated as described above. Each lithium secondary battery was charged up to 4.2 V at a constant current of 140 mA and then, discharged up to 2.75 V at a constant current of 140 mA up to 25 cycles, assuming the above charge and discharge as one cycle.

The discharge capacity at the first and second cycles and the capacity retention rate defined by the following formula were measured and results are shown in Table 1.

Capacity retention rate (%)=(Discharge capacity at 25th cycle/ discharge capacity at 1st cycle)

TABLE 1

|  | Discharge Capacity at 1st Cycle (mAh) | Discharge Capacity at 2nd Cycle (mAh) | Capacity Retention Rate (%) |
| --- | --- | --- | --- |
| Example 1 | 651.1 | 670.8 | 96.2 |
| Example 2 | 623.4 | 650.3 | 101.4 |
| Comparative Example 1 | 620.5 | 615.8 | 72.1 |

As shown in Table 1, lithium secondary batteries using electrodes of examples 1 and 2 fabricated by a method according to the present invention respectively have high discharge capacity and shows excellent charge/discharge cycle characteristics compared to the lithium secondary battery of the comparative example 1. This may be because no warping or wrinkle is produced on the current collectors of examples 1 and 2 and uniform charge/discharge reactions can be performed. Moreover, it is estimated that because a temperature rise of a metallic foil is suppressed when forming a thin film, the copper component in the metallic foil diffuses in a silicon thin film in a preferable state and a mixed layer is formed, thereby the adhesion between the silicon thin film and the metallic foil is improved.

According to the present invention, it is possible to prevent warping or wrinkle from being produced on a current collector when depositing an active thin film, thereby to exhibit high discharge capacity and excellent charge/discharge cycle characteristics.

What is claimed is:

1. A method for fabricating an electrode for lithium secondary battery having a film composed of active material on a metallic foil serving as a current collector, comprising the steps of:

applying a tension to said metallic foil so as to pull an area on which said film is formed, from both sides; and depositing said film on said metallic foil to which said tension is applied by sputtering, CVD, vacuum evaporation or thermal spraying.

2. The method for fabricating an electrode for lithium secondary battery according to claim 1, wherein said metallic foil is placed on a support and said tension is applied to the metallic foil so that said metallic foil is brought into contact with the support.

3. The method for fabricating an electrode for lithium secondary battery according to claim 2, wherein a device for controlling a temperature of said metallic foil is provided in said support.

4. The method for fabricating an electrode for lithium secondary battery according to claim 3, wherein said temperature control device is for cooling said metallic foil.

5. The method for fabricating an electrode for lithium secondary battery according to claim 2, wherein the portion of said support contacting with said metallic foil has a curved shape.

6. The method for fabricating an electrode for lithium secondary battery according to claim 5, wherein said support is a roller.

7. The method for fabricating an electrode for lithium secondary battery according to claim 1, wherein a temperature of said metallic foil increases so that a component of said metallic foil diffuses in said film to form a mixed layer at the interface between said metallic foil and said film, when depositing said film on said metallic foil.

8. The method for fabricating an electrode for lithium secondary battery according to claim 1, wherein said metallic foil has a thickness of 5 to 40 μm.

9. A method for fabricating an electrode for lithium secondary battery having a film composed of active material on a metallic foil serving as a current collector, comprising the steps of:

applying a tension to said metallic foil so as to pull an area on which said film is formed, from both sides; and depositing said film on said metallic foil to which said tension is applied;

wherein a temperature of said metallic foil increases so that a component of said metallic foil diffuses in said film to form a mixed layer at the interface between said metallic foil and said film, when depositing said film on said metallic foil.

10. The method for fabricating an electrode for lithium secondary battery according to claim 9, wherein said metallic foil is placed on a support and said tension is applied to the metallic foil so that said metallic foil is brought into contact with the support.

11. The method for fabricating an electrode for lithium secondary battery according to claim 10, wherein a device for controlling a temperature of said metallic foil is provided in said support.

12. The method for fabricating an electrode for lithium secondary battery according to claim 11, wherein said temperature control device is for cooling said metallic foil.

13. The method for fabricating an electrode for lithium secondary battery according to claim 10, wherein the portion of said support contacting with said metallic foil has a curved shape.

14. The method for fabricating an electrode for lithium secondary battery according to claim 13, wherein said support is a roller.

15. The method for fabricating an electrode for lithium secondary battery according to claim 9, wherein said metallic foil has a thickness of 5 to 40 $\mu$m.

* * * * *